United States Patent [19]

Hendrikx

[11] Patent Number: 5,630,542
[45] Date of Patent: May 20, 1997

[54] SOLDERING APPARATUS WITH ABRUPT SEPARATION OF SOLDER STREAMS

[75] Inventor: Adrianus J. M. Hendrikx, Etten-Leur, Netherlands

[73] Assignee: Soltec B.V., Oosterhout, Netherlands

[21] Appl. No.: 341,199

[22] Filed: Dec. 5, 1994

[51] Int. Cl.[6] ............................................. B23K 3/06
[52] U.S. Cl. .......................... 228/37; 228/260; 118/429
[58] Field of Search ............................. 228/180.1, 260, 228/37; 118/324, 429

[56] References Cited

U.S. PATENT DOCUMENTS

| | | | |
|---|---|---|---|
| 3,119,363 | 1/1964 | Rieben | 228/37 |
| 4,465,014 | 8/1984 | Bajka et al. | 228/37 |
| 4,981,249 | 1/1991 | Kawashima et al. | 228/37 |
| 5,379,931 | 1/1995 | Van Shaik | 228/37 |
| 5,388,752 | 2/1995 | Kawakatsu | 228/37 |

FOREIGN PATENT DOCUMENTS

| | | | |
|---|---|---|---|
| 2127150 | 12/1972 | Germany | 228/37 |
| 218368 | 12/1983 | Japan | 228/37 |
| 16857 | 1/1988 | Japan | 228/37 |
| 187261 | 7/1990 | Japan | 228/37 |

*Primary Examiner*—Samuel M. Heinrich
*Attorney, Agent, or Firm*—Banner & Witcoff, Ltd.

[57] ABSTRACT

The invention relates to a soldering apparatus, comprising a solder vessel; at least one soldering tower located in said solder vessel; transport means for transporting objects to be soldered over said soldering tower; solder wave generating means for generating a solder wave emerging from the apex of the soldering tower and contacting the objects to be soldered, the soldering tower comprising a weir such that at least a part of the solder wave flows parallel to the direction of movement of the objects to be soldered over said weir; and guide means for guiding said part of the solder wave such that the solder wave leaves the soldered object substantially abruptly. As a consequence of said feature the stream of solder is abruptly guided away from the printed circuit board, so that the possibilities for developing short circuits on the printed circuit board are substantially reduced.

23 Claims, 3 Drawing Sheets

SOLDERING APPARATUS WITH ABRUPT SEPARATION OF SOLDER STREAMS

BACKGROUND OF THE INVENTION

The present invention relates to a soldering apparatus, comprising:

a solder vessel;

at least one soldering tower located in said solder vessel;

transport means for transporting objects to be soldered over said soldering tower;

solder wave generating means for generating a solder wave emerging from the apex of the soldering tower and contacting the objects to be soldered, the soldering tower comprising a weir such that at least a part of the solder wave flows parallel to the direction of movement of the objects to be soldered over said weir.

Such soldering apparatuses are generally known.

In such prior art soldering apparatus a problem of solder bridges often develops on the soldered printed circuit boards. This may of later cause short circuits to develop between leads which should not be mutually connected. This problem is most severe, but not exclusive, in the soldering process within an atmosphere of inert gas.

Presumably the oxygenless atmosphere leads to an increase of the surface tension, co-operating in the development of solder bridges.

The aim of the present invention is to avoid the above mentioned problem.

This aim is reached by guide means for guiding said part of the solder wave such, that the solder wave leaves the soldered object substantially abruptly.

As a consequence of said feature the stream of solder is abruptly guided away from the printed circuit board, so that the possibilities for developing short circuits on the printed circuit board are substantially reduced.

BRIEF SUMMARY OF THE INVENTION

According to a preferred embodiment the guide means are adapted for guiding the solder wave from the objects to be soldered in a direction extending with an angle between 45° and 135° to the plane of the soldered objects.

According to a more preferred embodiment the guide means are adapted for guiding the solder wave from the objects to be soldered in a direction extending with an angle between 20° and 100° to the plane of the soldered objects.

In another embodiment, the guide means extend under an angle of 20 degrees with respect to vertical.

BRIEF DESCRIPTION OF THE DRAWINGS

Subsequently, the present invention will be elucidated with the help of the accompanying drawings, in which.

DETAILED DESCRIPTION OF THE INVENTION

Figure 1:
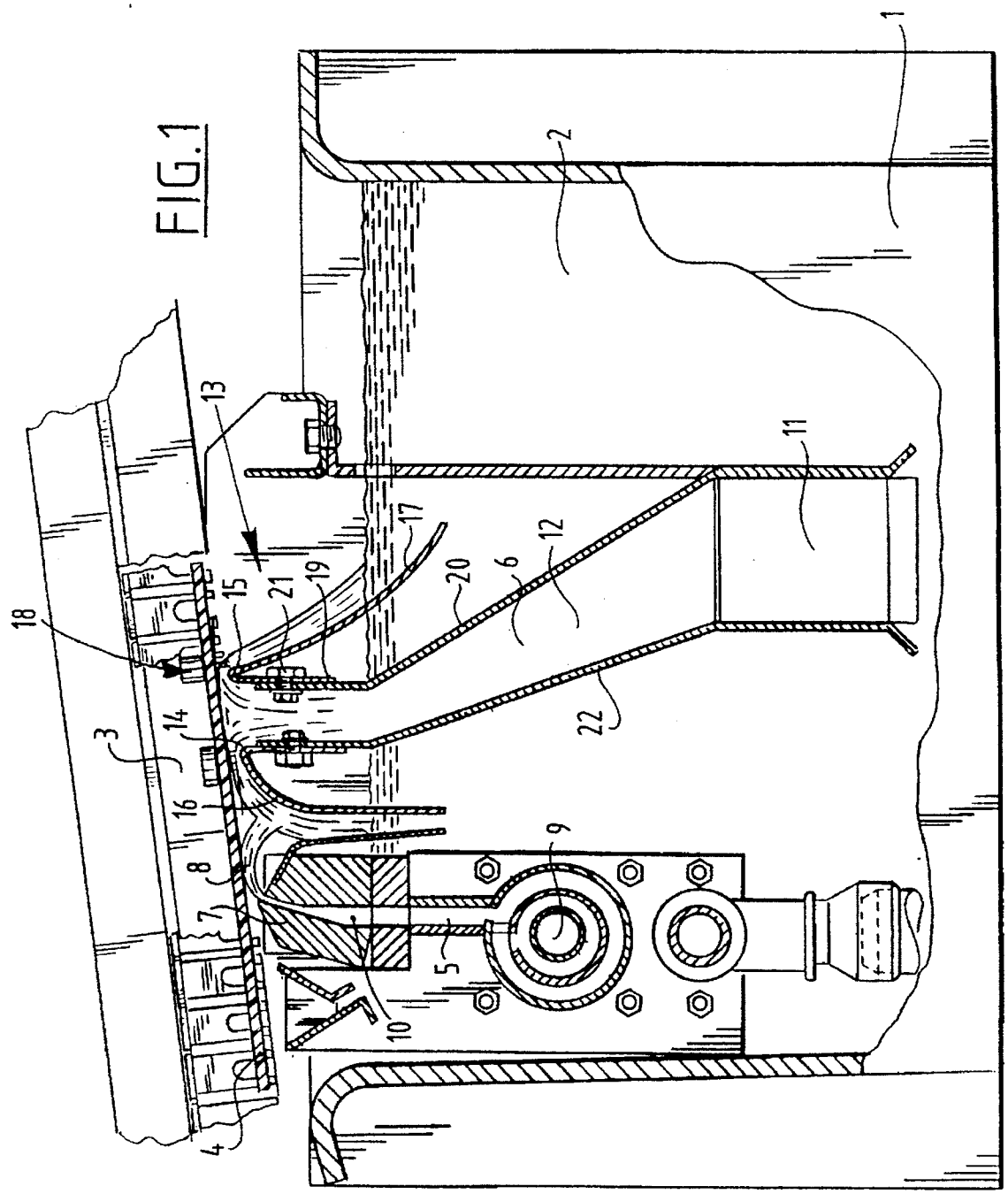
FIG. 1 shows a cross-sectional view of a first embodiment of the present invention.

The apparatus depicted in FIG. 1 shows a solder vessel 1 which is filled with solder tin 2. Solder tin is supposed to encompass each possible mixture of soldering metal which is fit for mutually connecting to other metals. Such a mixture does not necessarily has to contain tin.

Above the vessel 1 a conveyor 3 has been provided for conveying the objects to be soldered, in the present case printed circuit boards 4. Such a conveyor is the subject of the Dutch patent application 8901014 (United States equivalent U.S. Pat. No. 5,029,696). However, it is of course also possible to use other kinds of conveyor.

Further two soldering towers 5 and 6 have been provided in the solder vessel. The first solder tower comprises a spout 7 which is fit for generating a solder jet 8, contacting the printed circuit board from below. Therefore a pump 9 has been provided in the soldering tower 5 which is connected with the soldering spout 7 by means of channel 10.

The second soldering tower 6 comprises a wave shaper generating a solder wave. In the second soldering tower 6 a pump 11 has been provided, which is connected with the wave shaper 13 by means of a channel 12. It is further noted that both pumps 9 and 11 draw the molten solder from the solder vessel 1.

The wave shaper 13 comprises a front weir 14 and a back weir 15. The front weir 14 is connected with a guide plate 16 for guiding the frontal part of the solder wave emerging from the wave channel 12 towards the level of the solder 2 in the vessel 1 such, that splashing and the forming of droplets is avoided as far as possible.

On the rear side the weir 15 is connected with a rear guide plate 17 guiding the solder wave is emerging from the solder channel such, that said solder wave is abruptly disconnected from the object to be soldered, that is the printed circuit board, abruptly on the location 18. Further, the rear plate 17 is of a slightly concave shape, so that the flow of solder flowing over said plates has a more substantial horizontal component of movement, when it enters the fluid level of the solder in the solder vessel 1. This helps in avoiding splashing.

The plate 17 forms, together with the weir 15, a unitary part with a connection plate 19, which is connected with a wall 20 of the soldering tower by means of a bolt and nut connection 21. This bolt and nut connection 21 is such, that the heighth of the weir 15 and therewith of the plate 17 can be adjusted.

The apparatus is initially meant to be used with solder apparatuses, in which the solder process is executed in a non-oxidizing atmosphere, that is to say with an atmosphere of a so-called protective gas. The executing of the soldering process and the protection of a protective gas generally leads to a solder connection with an improved quality.

As a consequence of the fact that oxidation problems are less frequently in such a situation, the executing of the soldering process leads to the problem that bridges between leads protruding from the printed circuit boards are formed on the location, when the solder wave leaves the printed circuit board. The forming of such bridges is encouraged by the oxygenless atmosphere, which otherwise has an improving influence on the quality of the soldering connectors. Consequently, the present invention is in particular applicable in soldering apparatuses, using a protective gas. However, they are also applicable to such soldering apparatuses which execute a soldering process in a normal oxygen containing atmosphere.

The construction according to the present invention leads to an abrupt leaving of the object to be soldered by the solder wave at the location 18. This feature leads to the fact that there is hardly any opportunity for the solder wave to make unwanted connections between parts of the object to be soldered, that is the printed circuit board, as is the case in situations, in which the solder wave deviates only slightly from the object to be soldered, which situation promotes the formation of unwanted bridges between parts not to be connected together. The present invention avoids this by the abrupt separation of solder wave and printed circuit board.

Figure 2:
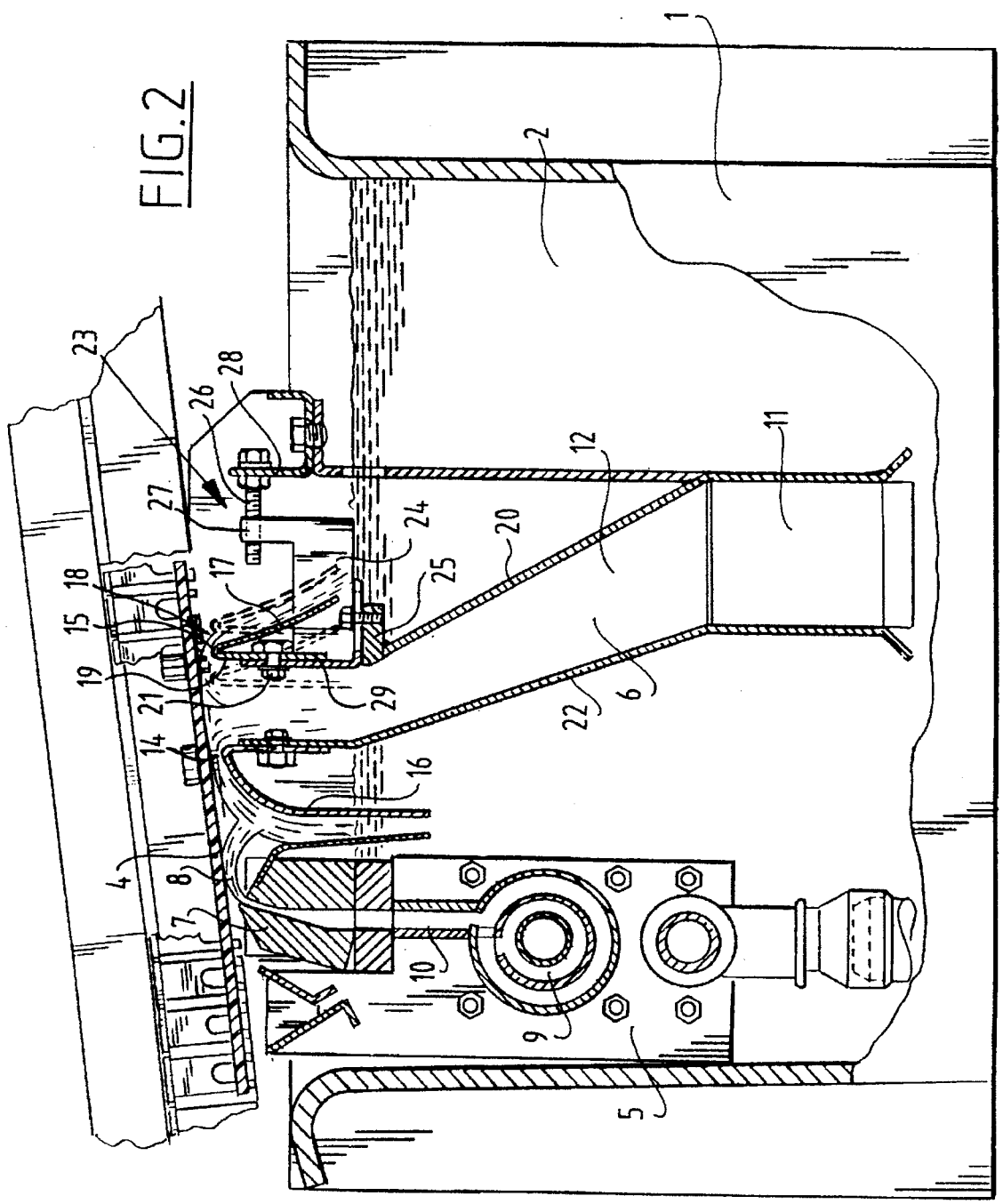
FIG. 2 shows a cross-sectional view of a second embodiment of the present invention.

FIG. 2 shows an embodiment which substantially corresponds to the construction depicted in FIG. 1. However, in the embodiment in FIG. 2 the upper part of the wall 20 of the soldering tower 6 has been replaced by an adjustable part 23. The adjustable part 23 consists of a carriage 24 which is movable in the horizontal direction over a strip 25 which is connected with the lower, remaining part of the wall 20.

The carriage is adjustable by means of a screw 26 extending through a threaded hole 27 provided in the carriage 24. The head of the screw 26 is connected with a strip 27 of the soldering tower construction. The carriage is connected with a plate 29 forming the upper part of the rear wall of the soldering tower to which, just as in the previous embodiment, the part consisting of the back rear 15, the rear guide plate 17 and the connecting plate 19 are connected by means of the bolt and nut connection 21.

This construction does not only allow the adjustment of the height of the rear wall of the soldering tower, but also of the width of the solder flow emerging from the tower.

Figure 3:
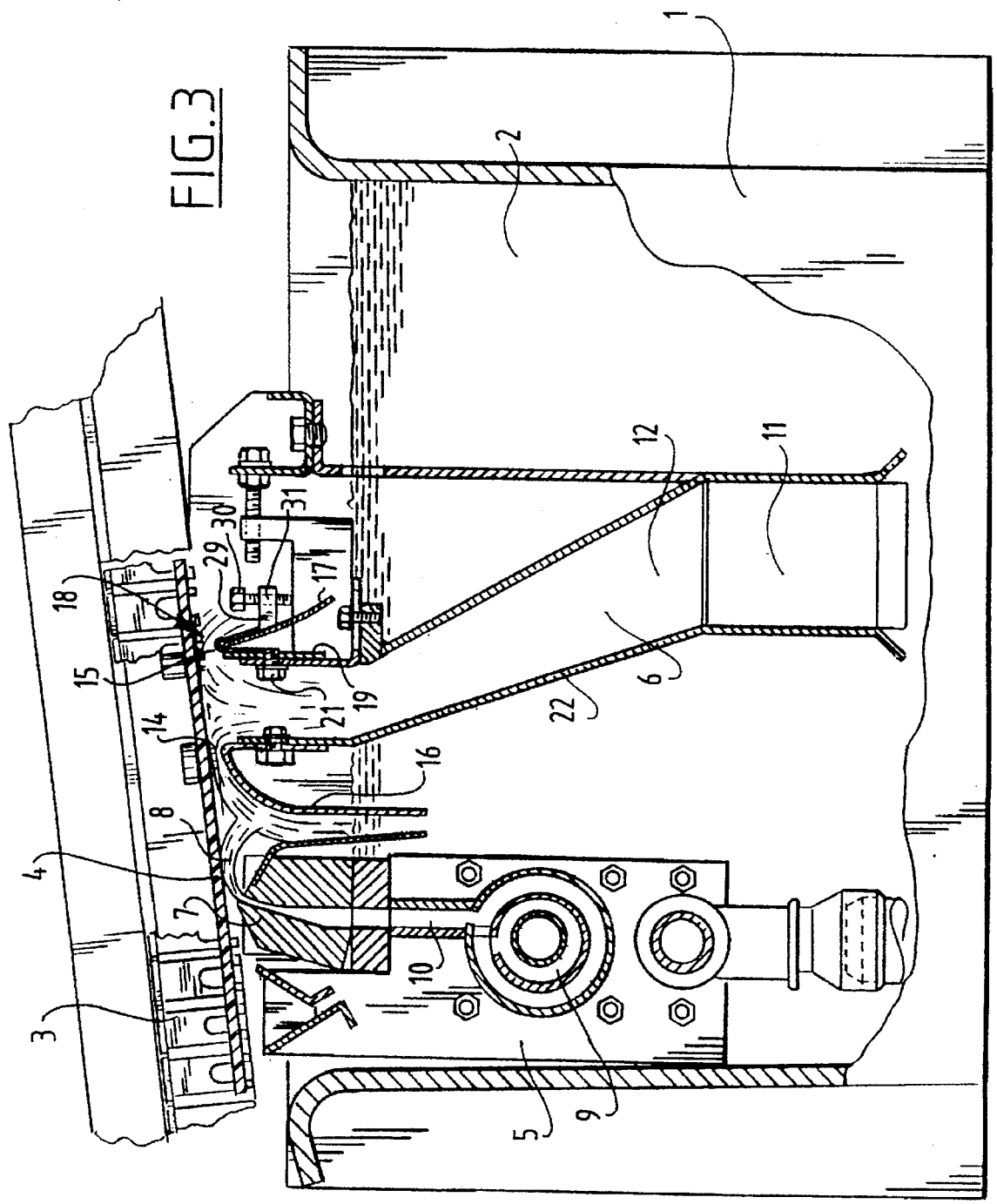
FIG. 3 shows a cross-sectional view of a third embodiment of the present invention.

Finally, the embodiment shown in FIG. 3 differs from the embodiment shown in FIG. 2 by the fact that the inclination of the rear guide plate 17 is adjustable by means of a bracket 29 connected to the guide plate and a screw 30 extending through a threaded hole 31 in the bracket, the free end of the screw contacting the carriage 24. This adjustability is for instance used to adapt the inclination of the guide plate to a possible change of the inclination of the conveyor 3.

Although all three aforementioned embodiments comprise two soldering towers, it will be clear to a skilled man that the present invention is also applicable to a situation in which only a single soldering tower is present.

It will also be clear that the scope of the present application is not limited to the embodiments shown, but that the scope of the present invention will be determined by the appended claims.

I claim:

1. Soldering apparatus, comprising:
 a solder vessel;
 at least one soldering tower located in said solder vessel;
 transport means for transporting objects to be soldered over said soldering tower; and
 solder wave generating means for generating a solder wave emerging from the apex of the soldering tower and contacting the objects to be soldered, the soldering tower comprising a weir such that at least part of the solder wave flows parallel to the direction of movement of the objects to be soldered over said weir, said solder wave generating means including guide means for guiding said part of the solder wave wherein the solder wave leaves the soldered object substantially abruptly, said guide means comprising a guide plate extending obliquely downward from the top of the weir, said guide plate being concave in the upward direction.

2. Apparatus according to claim 1, characterized in that the guide means are adapted for guiding the solder wave from the objects to be soldered in a direction extending with an angle between 45° and 135° to the surface of the soldered objects.

3. Apparatus according to claim 2, characterized in that the guide means are adapted for guiding the solder wave from the objects to be soldered in a direction extending with an angle between 60° and 120° to the plane of the soldered objects.

4. Apparatus according to claim 3, characterized in that the guide means are adapted for guiding the solder wave from the objects to be soldered in a direction extending with an angle between 80° and 100° to the plane of the soldered objects.

5. Apparatus according to claim 2, characterized in that the guide means extend under an angle of 20° with the vertical.

6. Apparatus according to claim 1, characterized in that the apparatus comprises at least two soldering towers and that only the most downstream tower in the direction of transport includes the guide means.

7. Apparatus according to claim 1, characterized in that the soldering tower comprises means for adjusting the height of the guide plate and the weir.

8. Apparatus according to claim 1, characterized in that the soldering tower comprises means for adjusting the weir and the guide plate in the horizontal direction.

9. Apparatus according to claim 1, characterized in that the inclination of the guide plate is adjustable.

10. Apparatus according to claim 7, characterized in that the soldering tower comprises means for adjusting the weir and the guide plate in the horizontal direction.

11. Apparatus according to claim 8, characterized in that the inclination of the guide plate is adjustable.

12. The soldering apparatus of claim 1, wherein said soldering apparatus applies said solder wave to contact said objects to be soldered in an oxygen-less atmosphere.

13. The soldering apparatus of claim 12, wherein said oxygen-less atmosphere comprises a protective gas.

14. A soldering apparatus, comprising:
 a solder vessel;
 at least one soldering tower located in said solder vessel;
 transport means for transporting objects to be soldered over said soldering tower; and
 solder wave generating means for generating a solder wave emerging from an apex of the soldering tower and contacting the objects to be soldered, the soldering tower comprising a weir such that at least part of the solder wave flows parallel to a direction of movement of the objects to be soldered over said weir, said solder wave generating means including guide means for guiding said part of the solder wave, wherein the solder wave leaves the soldered object substantially abruptly, said guide means extending under an angle of 20 degrees with respect to vertical and comprising a guide plate extending obliquely downward from a top of said weir, said guide plate being concave in an upward direction.

15. The soldering apparatus of claim 14, wherein said soldering tower comprises means for adjusting a height of the guide plate and the weir.

16. The soldering apparatus of claim 14, wherein the soldering tower comprises means for adjusting the weir and the guide plate in a horizontal direction.

17. The soldering apparatus of claim 15, wherein the soldering tower comprises means for adjusting the weir and the guide plate in a horizontal direction.

18. The soldering apparatus of claim 14, wherein an inclination of the guide plate is adjustable.

19. The soldering apparatus of claim 15, wherein an inclination of the guide plate is adjustable.

20. The soldering apparatus of claim 16, wherein an inclination of the guide plate is adjustable.

21. The soldering apparatus of claim 14, wherein said apparatus includes at least two soldering towers and only a most downstream tower in a direction of transport includes said guide means.

22. The soldering apparatus of claim 14, wherein said soldering apparatus applies said solder wave to contact said objects to be soldered in an oxygen-less atmosphere.

23. The soldering apparatus of claim 22, wherein said oxygen-less atmosphere comprises a protective gas.

* * * * *